(12) United States Patent
Wang et al.

(10) Patent No.: US 9,370,823 B2
(45) Date of Patent: Jun. 21, 2016

(54) METALLIC HOUSING OF ELECTRONIC DEVICE AND MANUFACTURING METHOD THEREOF

(71) Applicants: Fu Zhun Precision Industry (Shen Zhen) Co., Ltd., Shenzhen (CN); Foxconn Technology Co., Ltd., New Taipei (TW)

(72) Inventors: Cai-Hua Wang, Shenzhen (CN); Yue-Jian Li, Shenzhen (CN); Chen-Shen Lin, New Taipei (TW); Wen-Hsiung Chang, New Taipei (TW); Chun-Jung Chang, New Taipei (TW)

(73) Assignees: Fu Zhun Precision Industry (Shen Zhen) Co., Ltd., Shenzhen (CN); Foxconn Technology Co., Ltd., New Taipei (TW)

( * ) Notice: Subject to any disclaimer, the term of this patent is extended or adjusted under 35 U.S.C. 154(b) by 277 days.

(21) Appl. No.: 13/951,667

(22) Filed: Jul. 26, 2013

(65) Prior Publication Data

US 2015/0021064 A1    Jan. 22, 2015

(30) Foreign Application Priority Data

Jul. 19, 2013    (CN) .......................... 2013 1 03047908

(51) Int. Cl.

| B22D 19/00 | (2006.01) |
|---|---|
| B22D 17/22 | (2006.01) |
| H05K 5/04 | (2006.01) |
| H05K 5/02 | (2006.01) |
| B22D 17/00 | (2006.01) |
| B22D 19/04 | (2006.01) |

(52) U.S. Cl.
CPC ................ *B22D 19/00* (2013.01); *B22D 17/00* (2013.01); *B22D 17/2218* (2013.01); *B22D 19/04* (2013.01); *H05K 5/0243* (2013.01)

(58) Field of Classification Search
CPC ....... H05K 5/0243; B22D 19/04; B22D 19/00
USPC .............................................. 174/50; 164/111
See application file for complete search history.

(56) References Cited

U.S. PATENT DOCUMENTS

| 5,613,237 A * | 3/1997 | Bent ...................... H04B 1/086 220/4.02 |
|---|---|---|
| 7,038,916 B2 * | 5/2006 | Chen .................... H05K 5/0269 361/679.32 |

(Continued)

FOREIGN PATENT DOCUMENTS

| CN | 202617527 U | 12/2012 |
|---|---|---|
| CN | 102932503 A | 2/2013 |
| JP | 2010124072 A | 6/2010 |

*Primary Examiner* — William H Mayo, III
*Assistant Examiner* — Hiram E Gonzalez
(74) *Attorney, Agent, or Firm* — Novak Druce Connolly Bove + Quigg LLP

(57) ABSTRACT

A metallic housing of an electronic device, includes a metallic outer frame and an inner structural member. The metallic outer frame comprises a plurality of latching portions protruding, and a plurality of latching grooves. The inner structural member is made from metal-alloy and embedded in the outer frame by die-casting. The inner structural member comprises a peripheral sidewall, a plurality of engaging portions, and a plurality of matching portions. The plurality of engaging portions and the plurality of matching portions protrude from the peripheral sidewall outwardly. Each latching portion comprises at least two parallel latching ribs, and forms a receiving groove between two adjacent latching ribs. The plurality of engaging portions is respectively embedded in the plurality of receiving grooves, and the plurality of matching portions is respectively embedded in the plurality of latching grooves. The present disclosure further provides a manufacturing method for the metallic housing.

9 Claims, 6 Drawing Sheets

(56) References Cited

U.S. PATENT DOCUMENTS

| | | | |
|---|---|---|---|
| 8,101,859 B2 * | 1/2012 | Zadesky | G06F 1/1626 174/17 R |
| 8,190,222 B2 * | 5/2012 | Cheng | H04M 1/0202 220/4.02 |
| 2007/0169955 A1 * | 7/2007 | Pape | F16J 15/025 174/50 |
| 2009/0257207 A1 * | 10/2009 | Wang | G06F 1/1626 361/752 |
| 2009/0303669 A1 * | 12/2009 | Hsu | H04M 1/0249 361/679.01 |

* cited by examiner

METALLIC HOUSING OF ELECTRONIC DEVICE AND MANUFACTURING METHOD THEREOF

BACKGROUND

1. Technical Field

The present disclosure relates to a housing of an electronic device and a manufacturing method thereof, and more particularly to a metallic housing of an electronic device and a manufacturing method thereof.

2. Description of Related Art

Magnesium alloy, aluminum alloy, and zinc alloy are often used to make housings of electronic devices, due to their light weight, high scalability, easy molding, and high structural strength. Because metal-alloys do not possess the attractive metallic appearance of pure metals, a metallic layer is coated onto an outer surface of the housing to enhance the metallic appearance. However, the manufacturing procedure is complex and expensive.

Therefore, there is room for improvement in the art.

BRIEF DESCRIPTION OF THE DRAWINGS

The components in the drawings are not necessarily drawn to scale, the emphasis instead placed upon clearly illustrating the principles of the present disclosure. Moreover, in the drawings, like reference numerals designate corresponding parts throughout the several views.

DETAILED DESCRIPTION

Figure 1:
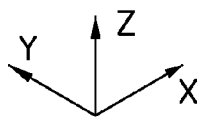
FIG. 1 is an isometric view of an embodiment of a metallic housing of an electronic device. The metallic housing includes an outer frame.
Figure 1:
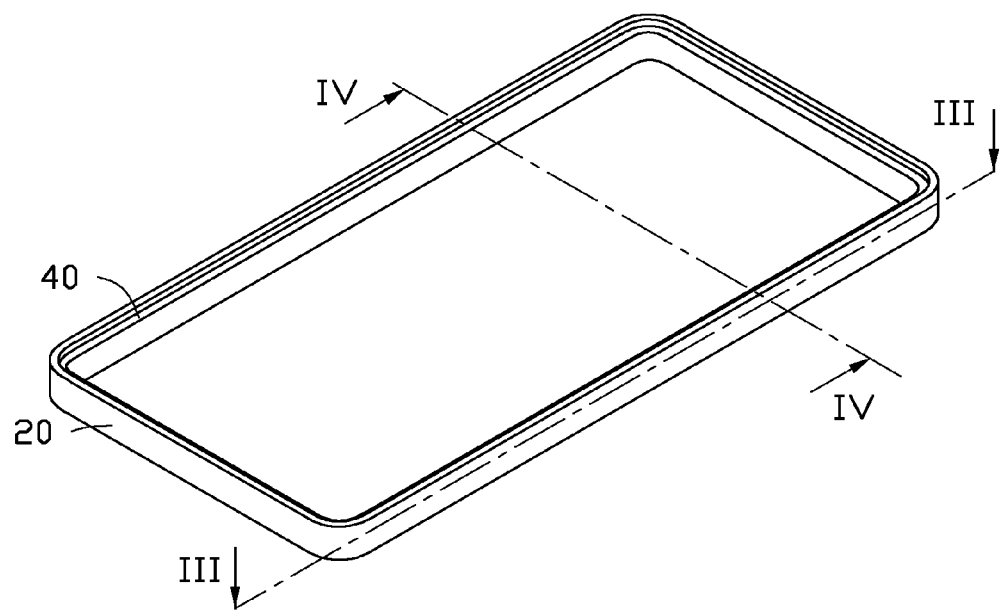
Figure 2:
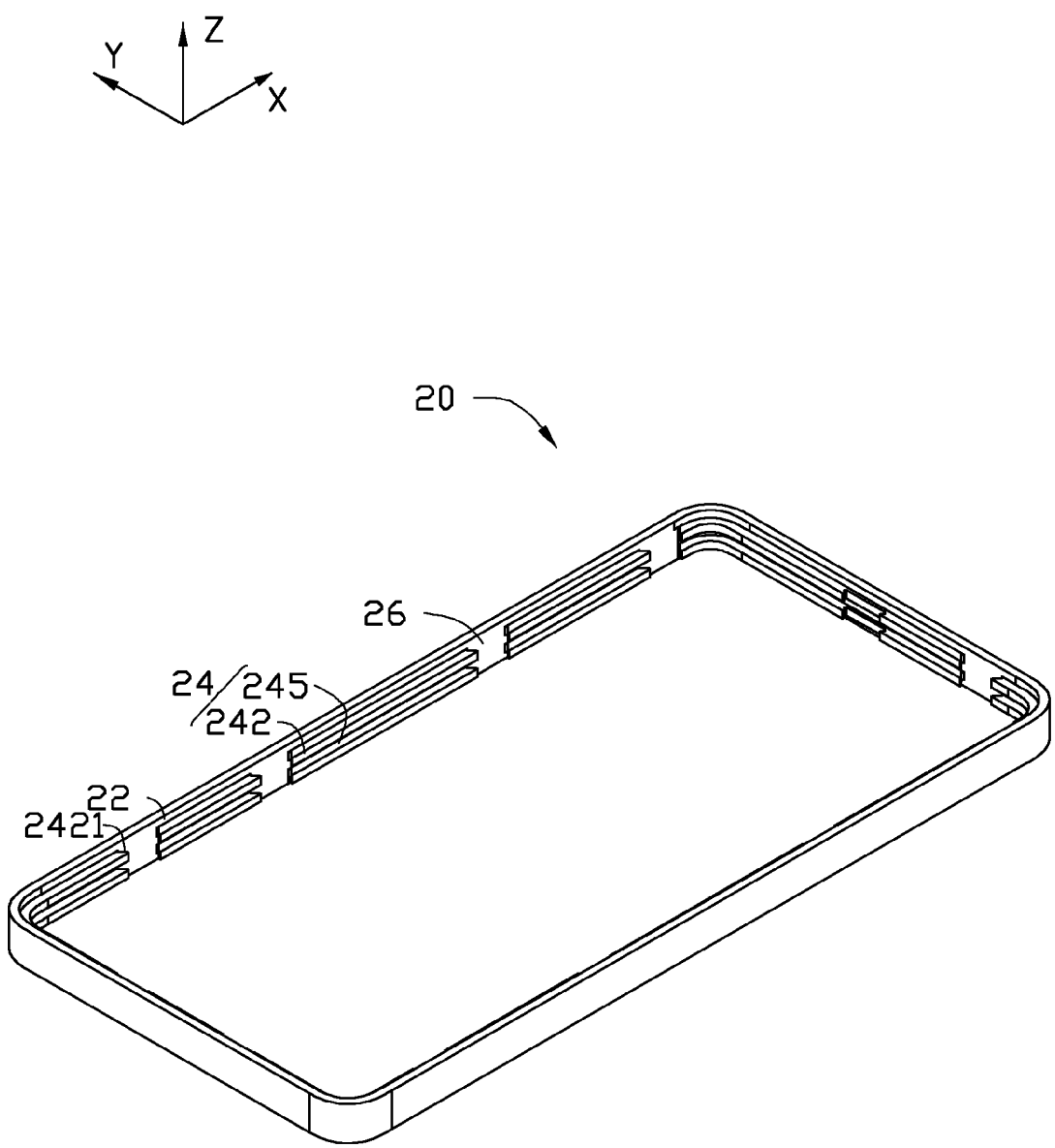
FIG. 2 is an isometric view of the outer frame of FIG. 1.
Figure 3:
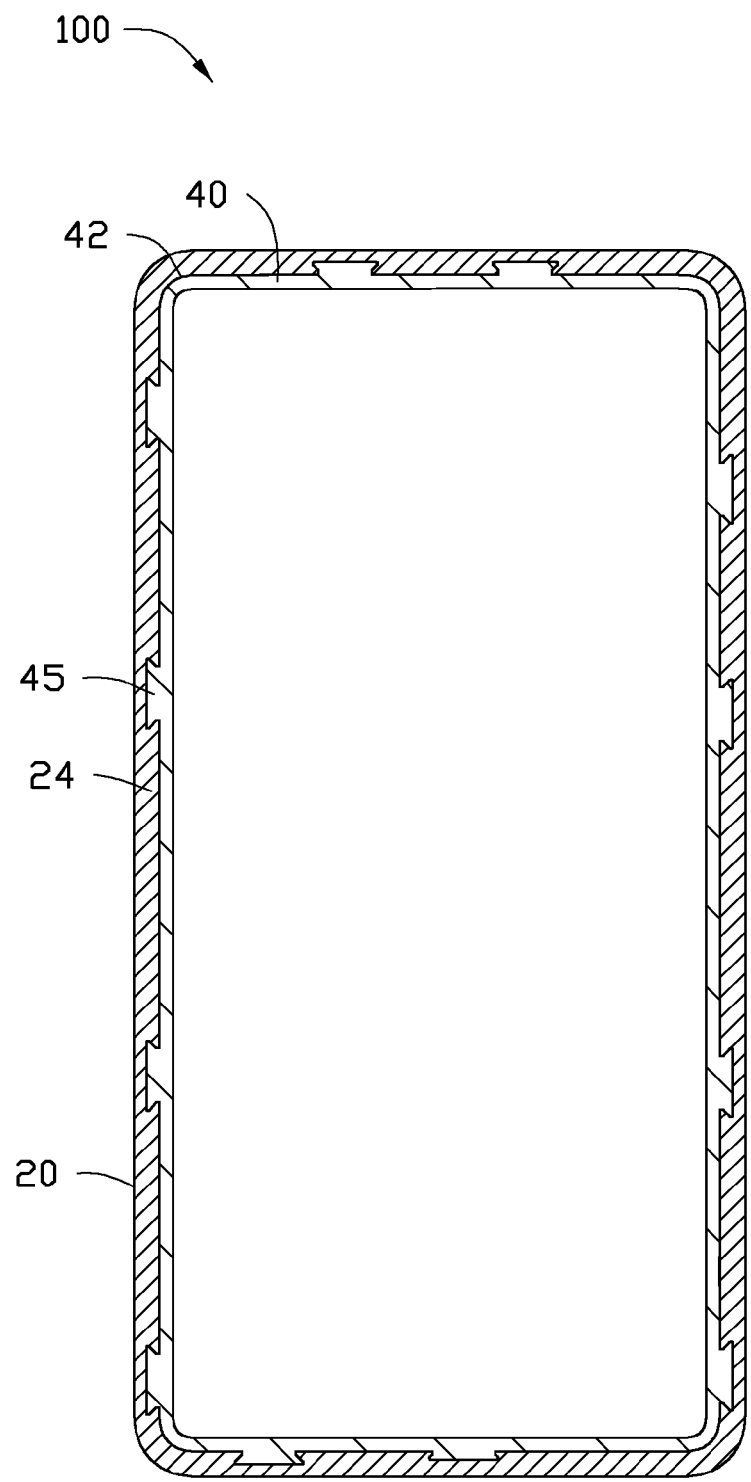
FIG. 3 is a cross-sectional view of the metallic housing of FIG. 1, taken along line III-III.

Referring to FIGS. 1 through 3, an embodiment of a metallic housing 100 in an electronic device (not shown) includes an outer frame 20 and an inner structural member 40. The inner structural member 40 is received within the outer frame 20 and is inset on an inner surface 22 of the outer frame 20.

Figure 4:
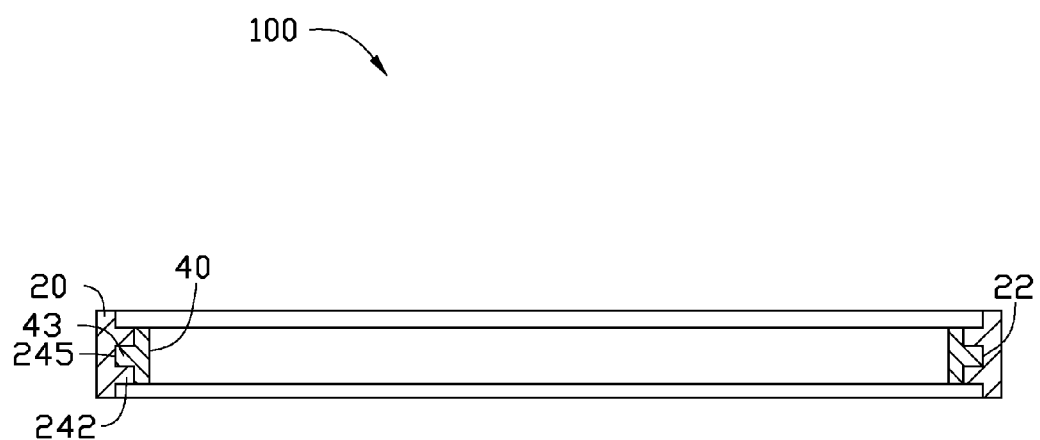
FIG. 4 is a cross-sectional view of the metallic housing of FIG. 1, taken along line IV-IV.

Also referring to FIG. 4, the outer frame 20 is substantially rectangular. The outer frame 20 includes a plurality of latching portions 24 and defines a plurality of latching grooves 26. The plurality of latching portions 24 are arranged on the inner surface 22 along an extending direction of the outer frame 20. The latching portions 24 are spaced from each other, thereby forming the plurality of latching grooves 26 inbetween. Each latching portion 24 includes a pair of protruding latching ribs 242 and a receiving groove 245 defined between the pair of latching ribs 242. The pair of latching ribs 242 are substantially parallel to each other. The pair of latching ribs 242 extends along an extending direction of the outer frame 20. Each latching rib 242 defines an inclining surface 2421 on opposite ends. The inclining surface 2421 and the inner surface 22 of the outer frame 20 cooperatively form an angle. A cross-sectional view of the receiving groove 245 is substantially rectangular. Each latching groove 26 is located between two adjacent latching portions 24, and is bounded by two inclining surfaces 2421 of the two adjacent latching portions 24. In the embodiment, the latching groove 26 is a dovetail groove.

The outer frame 20 is made of stainless steel, aluminum, titanium, or the like. In the illustrated embodiment, the outer frame 20 is made of stainless steel by die-casting. A number of latching ribs 242 and a number of receiving grooves 245 may be changed according to requirements.

In the illustrated embodiment, the inner structural member 40 is an internal frame similar to the outer frame 20. The inner structural member 40 includes a peripheral sidewall 42, a plurality of engaging portions 43 protruding from the peripheral sidewall 42, and a plurality of matching portions 45. The plurality of engaging portions 43 protrude from an outer surface of the peripheral sidewall 42 and are spaced from each other. The engaging portion 43 is a rib extending along an extending direction of the peripheral sidewall 42 and is received by a corresponding receiving groove 245 of the outer frame 20. Each engaging portion 43 resists two latching ribs 242 at opposite sides to hold the inner structural member 40. Each of the engaging portions 43 further resists the inner surface 22 on a bottom of the corresponding receiving groove 245 to hold the inner structural member 40. The plurality of matching portions 45 protrude from an outer surface of the peripheral sidewall 42 and are spaced from each other. The plurality of matching portions 45 are respectively received in the plurality of latching grooves 26 of the outer frame 20. Each matching portion 45 is a dovetail block and resists two latching portions 24 at opposite sides, thereby holding the inner structural member 40. The inner structural member 40 may be made of magnesium alloy, aluminum alloy, titanium alloy, or other metal-alloy. The inner structural member 40 may be made by die-casting or forging. In the embodiment, the inner structural member 40 is made from aluminum alloy by die-casting. In other embodiments, the inner structural member 40 may be a metallic board.

A shape of the latching portions 24 is not limited, and the inner structural member 40 may be equipped with a plurality of engaging structures to engage with the plurality of latching portions 24. If the plurality of latching portions 24 and the plurality of engaging portions 43 can hold the inner structural member 40 in the outer frame 20 steadily, the plurality of latching grooves 26 and the plurality of matching portions 45 may be omitted.

Figure 5:
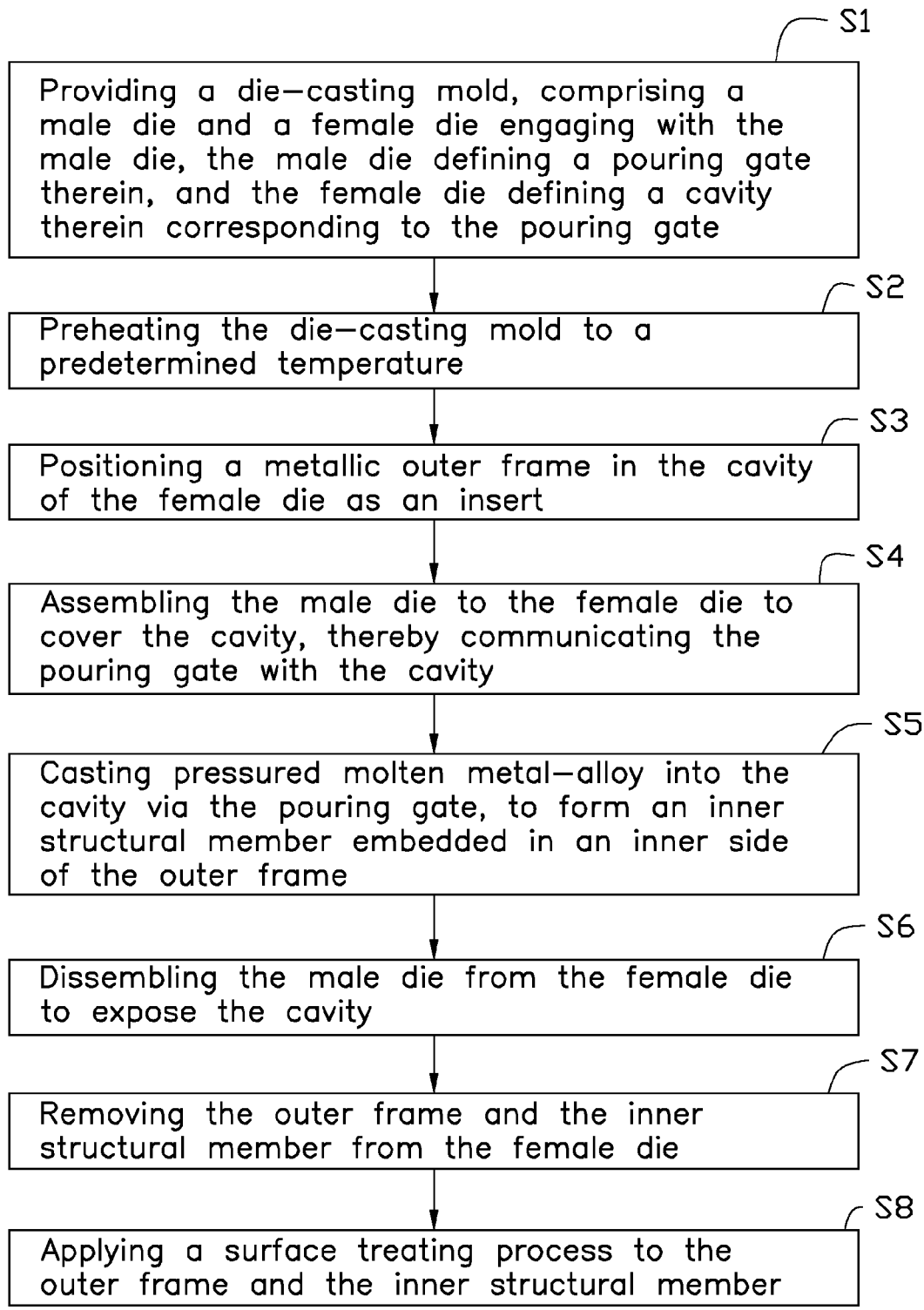
FIG. 5 is a flow chart of an embodiment of a manufacturing method for the metallic housing of FIG. 1.
Figure 6:
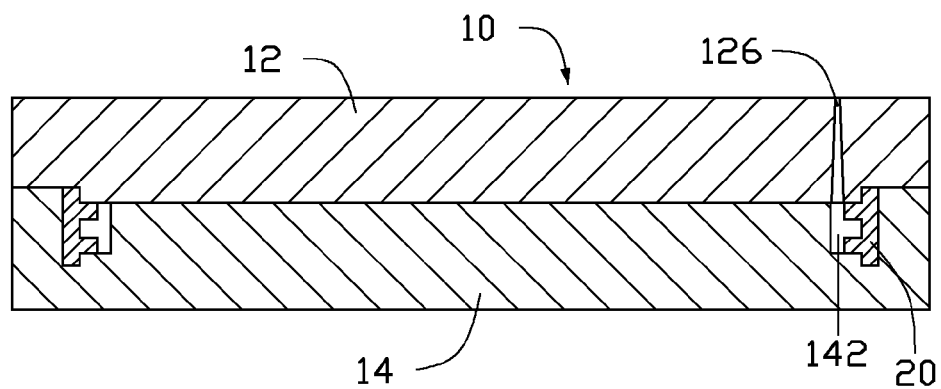
FIG. 6 is a cross-sectional view of a die-casting mold employed in the manufacturing method for the metallic housing of FIG. 1.

Referring to FIGS. 5 and 6, an embodiment of a manufacturing method of the metallic housing 100 is illustrated.

Step S1: A die-casting mold 10 is provided. The die-casting mold 10 includes a male die 12 and a female die 14 engaging with the male die 12. The male die 12 defines a pouring gate 126 therein, and the female die 14 defines a cavity 142 therein corresponding to the pouring gate 126.

Step S2: The die-casting mold 10 is preheated to a predetermined temperature. If the temperature of the die-casting mold 10 satisfies a requirement of the die-casting process, step S2 may be omitted.

Step S3: A metallic outer frame 20 is positioned in the cavity 142 of the female die 14 as an insert. The outer frame 20 includes a plurality of latching portions 24 and defines a plurality of latching grooves 26 therein. The plurality of latching portions 24 are arranged on the inner surface 22 along an extending direction of the outer frame 20. The plurality of latching portions 24 are spaced from each other. Each latching portion 24 includes a pair of latching ribs 242 protruding from the inner surface 22 toward an inner side of the outer frame 20, and a receiving groove 245 between the pair of latching ribs 242.

The outer frame 20 may be made by die-casting, extruding, forging, or punching. In a preferred embodiment, the outer frame 20 is made by die-casting. The plurality of latching portions 24 and the plurality of latching grooves 26 may be made by a CNC (computer number control) process, or formed by a die-casting process. In a preferred embodiment, the plurality of latching portions 24 and the plurality of latching grooves 26 are formed by a die-casting process.

Step S4: The male die 12 is assembled onto the female die 14 to cover the cavity, thereby communicating the pouring gage 126 with the cavity 142.

Step S5: pressured molten metal-alloy enters into the cavity 142 via the pouring gate 126 to form an inner structural member 40 embedded in an inner side of the outer frame 20. The inner structural member 40 includes a plurality of engaging portions 43 corresponding to the plurality of receiving grooves 245, and a plurality of matching portions 45 corresponding to the plurality of latching grooves 26. Molten metal-alloy is molded to the outer frame 20 and cooled to form the inner structure 40, thereby forming the plurality of engaging portions 43 received in the plurality of receiving grooves 245, and forming the plurality of matching portions 45 respectively received in the plurality of latching grooves 26.

Step S6: The male die 12 is disassembled from the female die 14 to expose the cavity 142.

Step S7: The outer frame 20 and the inner structural member 40 are removed from the female die 14.

Step S8: The outer frame 20 and the inner structural member 40 undergo a surface treating process. In the embodiment, burrs and other defects formed on the inner structural member 40 are removed by the surface treating process. If an appearance of the inner structural member 40 is qualified enough, step S8 may be omitted.

A surface treating process such as polishing step may be added between step S2 and step S3: the outer frame 20 undergoes a polishing process to remove burrs thereon, such that the outer frame 20 achieves a more attractive metallic appearance.

The outer frame 20 may be made from stainless steel, aluminum, titanium, or the like, thereby achieving a required appearance of the metallic housing 100. Additionally, because the inner structural member 40 is formed from metal-alloy material, a weight of the metallic housing 100 is reduced.

Finally, while various embodiments have been described and illustrated, the disclosure is not to be construed as being limited thereto. Various modifications can be made to the embodiments by those skilled in the art without departing from the true spirit and scope of the disclosure as defined by the appended claims.

What is claimed is:

1. A metallic housing of an electronic device, comprising a metallic outer frame and an inner structural member, wherein the metallic outer frame is substantially rectangular and comprises an inner surface, a plurality of latching portions protruding from the inner surface inwardly, and a plurality of latching grooves each formed between two adjacent latching portions; the inner structural member is made from metal-alloy and embedded in the inner surface of the outer frame by die-casting; the inner structural member comprises a peripheral sidewall, a plurality of engaging portions, and a plurality of matching portions; the plurality of engaging portions and the plurality of matching portions protrude from the peripheral sidewall outwardly; each latching portion comprises at least two parallel latching ribs, and forms a receiving groove between two adjacent latching ribs, the at least two latching ribs align and extend along an extending direction of the metallic outer frame, the at least two latching ribs transverse a corner of the metallic outer frame; the plurality of engaging portions are respectively embedded in the plurality of receiving grooves, and the plurality of matching portions extends along a direction perpendicular to the extending direction of the metallic outer frame and are respectively embedded in the plurality of latching grooves on two opposite sides of the receiving groove.

2. The metallic housing of claim 1, wherein a cross-sectional view of the receiving groove is in a stepped shape or a rectangle.

3. The metallic housing of claim 1, wherein each latching rib defines a pair of inclining surfaces on opposite ends to engage the latching groove in a dovetail shape.

4. The metallic housing of claim 1, wherein the outer frame is made from stainless steel, aluminum, or titanium, and the inner structural member is made from magnesium alloy, or aluminum alloy.

5. The metallic housing of claim 1, wherein the inner structural member is an inner metallic frame or an inner metallic board.

6. A metallic housing, comprising a metallic outer frame and an inner structural member, wherein the metallic outer frame is substantially rectangular and comprises an inner surface and a plurality of latching portions protruding from the inner surface inwardly, and a plurality of latching grooves each formed between two adjacent latching portion; the inner structural member is made from metal-alloy and embedded in the inner surface of the outer frame by die-casting; the inner structural member comprises a peripheral sidewall, a plurality of matching portions, and a plurality of engaging portions protruding from the peripheral sidewall outwardly; the plurality of engaging portions are spaced from each other; the plurality of engaging portions and the plurality of matching portions protrude from the peripheral sidewall outwardly; each latching portion comprises at least two parallel latching ribs, and forms a receiving groove between two adjacent latching ribs, the at least two latching ribs align and extend along an extending direction of the metallic outer frame, the at least two latching ribs transverse a corner of the metallic outer frame; the plurality of engaging portions are respectively embedded in the plurality of receiving grooves, and the plurality of matching portions extends along a direction perpendicular to the extending direction of the metallic outer frame, and are respectively embedded in the plurality of latching grooves on two opposite sides of the receiving groove.

7. The metallic housing of claim 6, wherein each latching portions defines a pair of inclining surfaces on opposite ends to engage the latching groove in a dovetail shape.

8. The metallic housing of claim 6, wherein the outer frame is made of stainless steel, aluminum, or titanium, and the inner structural member is made of magnesium alloy, or aluminum alloy.

9. The metallic housing of claim 6, wherein the inner structural member is an inner metallic frame or an inner metallic board.

* * * * *